United States Patent
Zhao

(10) Patent No.: US 10,256,153 B2
(45) Date of Patent: Apr. 9, 2019

(54) SEMICONDUCTOR APPARATUS AND MANUFACTURING METHOD

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Hai Zhao, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/786,250

(22) Filed: Oct. 17, 2017

(65) Prior Publication Data

US 2018/0108569 A1 Apr. 19, 2018

(30) Foreign Application Priority Data

Oct. 17, 2016 (CN) .......................... 2016 1 0900638

(51) Int. Cl.
*H01L 21/762* (2006.01)
*H01L 29/06* (2006.01)
(Continued)

(52) U.S. Cl.
CPC ............... *H01L 21/823431* (2013.01); *H01L 21/76224* (2013.01); *H01L 21/823412* (2013.01);
(Continued)

(58) Field of Classification Search
CPC ..... H01L 21/823431; H01L 21/823412; H01L 21/823418; H01L 21/823821;
(Continued)

(56) References Cited

U.S. PATENT DOCUMENTS 9,368,496 B1    1/2016  Yu et al.
9,337,318 B2*   5/2016  Liu .................... H01L 29/6681
(Continued)

FOREIGN PATENT DOCUMENTS

EP    3163628 A1    5/2017

OTHER PUBLICATIONS

European Search Report corresponding to EP application No. 17196526 dated Feb. 6, 2018.

*Primary Examiner* — Eric A. Ward
(74) *Attorney, Agent, or Firm* — Innovation Counsel LLP

(57) ABSTRACT

A semiconductor apparatus and its manufacturing method are presented. The method entails providing a substrate structure comprising a substrate, one or more fins positioned along a first direction on the substrate, and a separation region surrounding the fins. The separation region comprises a first separation region neighboring a first side of the fins and a second separation region neighboring a second side of the fins; forming a first and a second insulation layers on the substrate structure; forming a barrier layer; performing a first etching process using the barrier layer as a mask; removing the barrier layer; performing a second etching process using the remaining second insulation layer as a mask; forming a third insulation layer on side surfaces of the
(Continued)

remaining first and second insulation layers; and performing a third etching process using the remaining second insulation layer and the third insulation layer as a mask.

12 Claims, 19 Drawing Sheets

(51) Int. Cl.
      *H01L 29/78*       (2006.01)
      *H01L 21/8234*       (2006.01)
      *H01L 21/8238*       (2006.01)
      *H01L 27/088*       (2006.01)
      *H01L 29/66*       (2006.01)
      *H01L 27/092*       (2006.01)

(52) U.S. Cl.
      CPC .............. *H01L 21/823814* (2013.01); *H01L 21/823821* (2013.01); *H01L 27/0886* (2013.01); *H01L 29/66795* (2013.01); *H01L 29/785* (2013.01); *H01L 27/0924* (2013.01)

(58) Field of Classification Search
CPC ......... H01L 21/823814; H01L 21/8258; H01L 21/76224–21/76237; H01L 27/0605; H01L 27/0886; H01L 27/0924; H01L 29/66795–29/66818; H01L 29/785–29/7856
See application file for complete search history.

(56) References Cited

U.S. PATENT DOCUMENTS

| | | |
|---|---|---|
| 2015/0147860 A1 | 5/2015 | Kim et al. |
| 2015/0294902 A1* | 10/2015 | Carothers ......... H01L 21/76278 257/506 |
| 2016/0079125 A1 | 3/2016 | Kim et al. |
| 2016/0225848 A1 | 8/2016 | Zang et al. |
| 2018/0108572 A1* | 4/2018 | Zhao ................. H01L 21/82343 |

* cited by examiner

SEMICONDUCTOR APPARATUS AND MANUFACTURING METHOD

CROSS-REFERENCE TO RELATED APPLICATION

This application claims priority to and benefit of Chinese Patent Application No. 201610900638.X filed on Oct. 17, 2016, which is incorporated herein by reference in its entirety.

BACKGROUND

(a) Field of the Invention

This inventive concept relates to semiconductor technologies, more specifically, a semiconductor apparatus and its manufacturing method.

(b) Description of the Related Art

In Fin Field Effect Transistor (FinFET), dummy gate structures are formed on Shallow Trench Isolation (STI) to control Critical Dimension (CD) uniformity. To improve the quality of FinFET, the upper portion of the fins neighboring the dummy gate structures are etched to form dents, in which semiconductor materials may be epitaxially grown to induce stress to a channel.

However, since the STI regions are typically lower than the fins, the bottom portions of the dummy gate structures on STI are also lower than the fins. The position shift of the dummy gate structures due to the deviations in the manufacturing process may cause the fins to bridge with the dummy gate structures to cause electrical leakage and deteriorate the performance of the semiconductor devices. Additionally, the position shift of the dummy gate structures may distort the contour of the epitaxially grown semiconductor materials and affect the induced stress in the channel, which may lower the migration rate of charge carriers in the semiconductor devices and adversely affect its performance.

Therefore a semiconductor manufacturing method that can reduce or eliminate bridge between the components and improve reliability and migration rate of charge carriers in the device is desirable.

SUMMARY

This summary is related to some of many embodiments of the inventive concept disclosed herein and is not intended to limit the scope of this inventive concept.

A method for manufacturing a semiconductor apparatus, comprising:
  providing a substrate structure, wherein the substrate structure comprises:
    a substrate;
    one or multiple fins positioned along a first direction on the substrate; and
    a separation region surrounding the fins,
    wherein an upper surface of the separation region is on a substantially same horizontal level as an upper surface of the fins, the separation region comprises a first separation region neighboring a first side of the fins along the first direction, and a second separation region neighboring a second side of the fins along a second direction that is different from the first direction;
  forming a first insulation layer on the substrate structure;
  forming a second insulation layer on the first insulation layer;
  forming a barrier layer on a first portion of the second insulation layer on the first separating region;
  performing a first etching process using the barrier layer as a mask to remove a second portion of the second insulation layer that is not covered by the barrier layer;
  removing the barrier layer;
  performing a second etching process using the remaining second insulation layer as a mask to remove a portion of the first insulation layer that is not covered by the remaining second insulation layer;
  forming a third insulation layer on side surfaces of the remaining first insulation layer and the remaining second insulation layer;
  performing a third etching process using the remaining second insulation layer and the third insulation layer as a mask to remove a portion of the second separation region that is not covered by the remaining second insulation layer or the third insulation layer; and
  removing the remaining second insulation layer and the third insulation layer.

Additionally, in the aforementioned method, the barrier layer may cover a portion of the second insulation layer on the upper surface of the fins neighboring the first separation region.

Additionally, in the aforementioned method, forming a third insulation layer on side surfaces of the remaining first insulation layer and the remaining second insulation layer may include:
  forming an insulation material layer to cover a surface that is not covered by either the remaining first insulation layer or the remaining second insulation layer, side surfaces of the remaining first insulation layer and the remaining second insulation layer, and an upper surface of the remaining second insulation layer; and
  removing a portion of the insulation material layer on the surface that is not covered by the remaining first insulation layer and the remaining second insulation layer, and on the upper surface of the remaining second insulation layer, the remaining insulation material layer is the third insulation layer.

Additionally, in the aforementioned method, the first insulation layer and the second insulation layer may have different etching ratios.

Additionally, in the aforementioned method, the first insulation layer is an oxide layer, the second and third insulation layers may be a nitride layer.

Additionally, in the aforementioned method, providing a substrate structure may include:
  providing an initial substrate;
  forming a patterned hard mask layer on the initial substrate;
  etching the initial substrate using the hard mask layer as a mask to form the substrate and one or multiple fins on the substrate;
  depositing separation material to fill areas surrounding the fins, wherein an upper surface of the separation material is on a substantially same horizontal level with an upper surface of the hard mask layer;
  etching back the separation material to expose the hard mask layer; and
  removing the hard mask layer to form the substrate structure.

Additionally, in the aforementioned method, the initial substrate may include an initial semiconductor layer and an initial oxide layer on the initial semiconductor layer, and the fins may include a semiconductor layer and an oxide layer on the semiconductor layer.

Additionally, the aforementioned method may further include:

forming a first gate structure on the fins; and forming a second gate structure on the remaining first insulation layer.

Additionally, the aforementioned method further comprises:

etching the fins on two sides of the first gate structure using the first gate structure and the second gate structure as masks to form dents; and epitaxially growing semiconductor materials in the dents to form a source region and a drain region.

Additionally, in the aforementioned method, the semiconductor materials comprise silicon-germanium (SiGe) or silicon carbide (SiC).

Additionally, in the aforementioned method, the first gate structure includes;

a first dielectric layer on the fins;

a first gate on the first dielectric layer;

a first hard mask layer on the first gate; and first separation objects on side surfaces of the first dielectric layer, the first gate, and the first hard mask layer, and the second gate structure includes:

a second dielectric layer on the remaining first insulation layer;

a second gate on the second dielectric layer;

a second hard mask layer on the second gate; and second separation objects on side surfaces of the second dielectric layer, the second gate, and the second hard mask layer, wherein the second separation objects cover a portion of the upper surfaces of the fins next to the first separation region that is underneath the second gate structure.

Additionally, in the aforementioned method, the first dielectric layer and the second dielectric layer may be made of silicon oxide, the first gate and the second gate are made of poly-crystalline silicon, and the first hard mask layer and the second hard mask layer are made of silicon nitride.

This inventive concept further presents a semiconductor apparatus, including:

a substrate;

one or multiple fins positioned along a first direction on the substrate;

a separation region surrounding the fins, wherein the separation region comprises a first separation region neighboring a first side of the fins along the first direction, and a second separation region neighboring a second side of the fins along a second direction that is different from the first direction, wherein an upper surface of the first separation region is on a substantially same horizontal level with an upper surface of the fins, and wherein an upper surface of the second separation region is lower than the upper surface of the fins; and a first insulation layer on the first separation region.

Additionally, in the aforementioned apparatus, the first insulation layer may further cover a portion of the upper surfaces of the fins next to the first separation region.

Additionally, the aforementioned apparatus may further include:

a first gate structure on the fins; and a second gate structure on the first insulation layer.

Additionally, the aforementioned apparatus may further include:

a source region next to a first side of the first gate structure formed by epitaxially growing a semiconductor material; and a drain region next to a second side of the first gate structure formed by epitaxially growing the semiconductor material.

Additionally, in the aforementioned apparatus, the semiconductor materials comprise silicon-germanium (SiGe) or silicon carbide (SiC).

Additionally, in the aforementioned apparatus, the first gate structure may include:

a first dielectric layer on the fins;

a first gate on the first dielectric layer;

a first hard mask layer on the first gate; and first separation objects on side surfaces of the first dielectric layer, the first gate, and the first hard mask layer, and the second gate structure comprises:

a second dielectric layer on the remaining first insulation layer;

a second gate on the second dielectric layer;

a second hard mask layer on the second gate; and second separation objects on side surfaces of the second dielectric layer, the second gate, and the second hard mask layer, wherein the second separation objects cover a portion of the upper surface of the fins next to the first separation region that is underneath the second gate structure.

Additionally, in the aforementioned apparatus, the first dielectric layer and the second dielectric layer may be made of silicon oxide, the first gate and the second gate are made of poly-crystalline silicon, and the first hard mask layer and the second hard mask layer are made of silicon nitride.

DETAILED DESCRIPTION OF THE EMBODIMENTS

Figure 1:
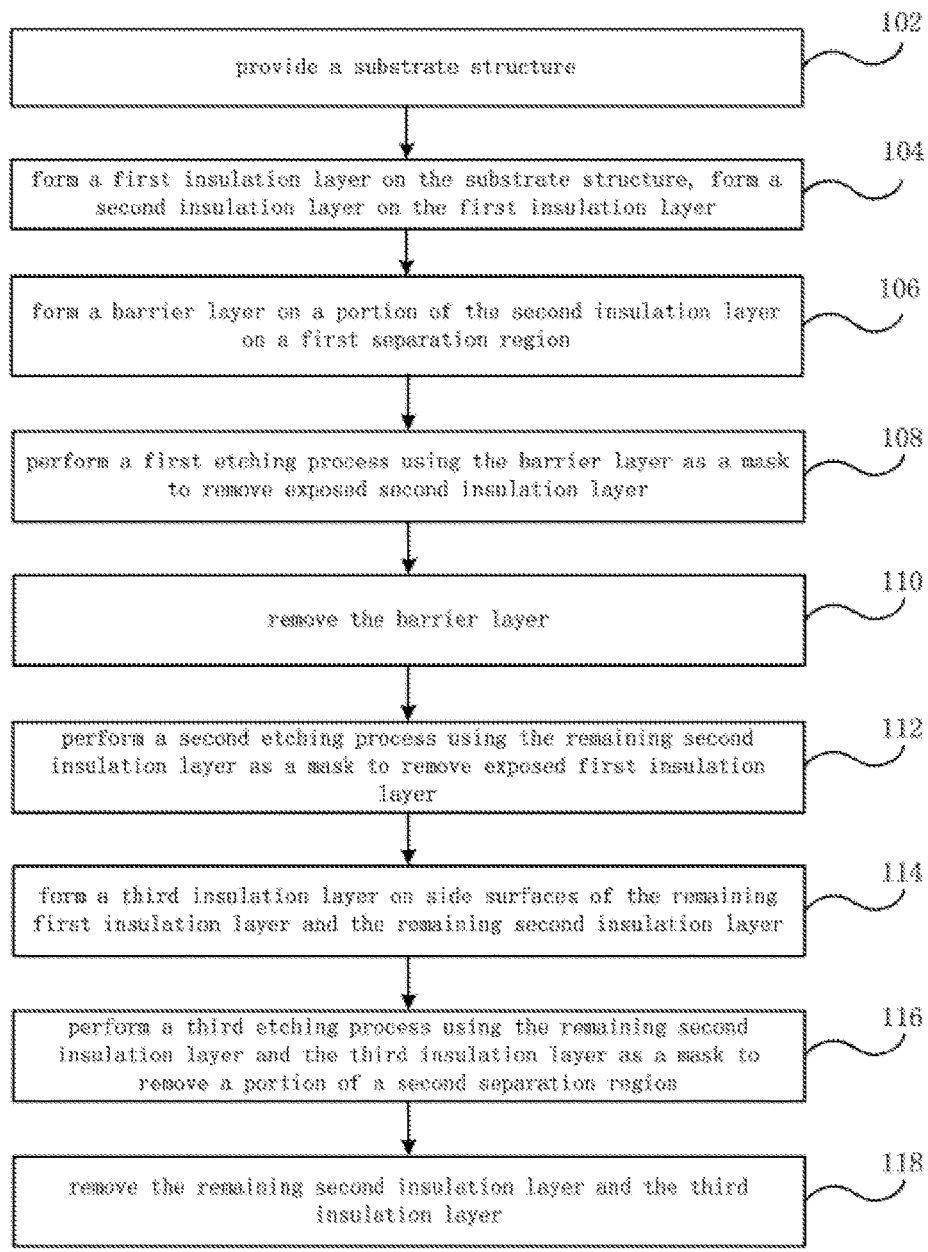
FIG. 1 shows a flowchart illustrating the procedures in a manufacturing method of a semiconductor apparatus in accordance with one or more embodiments of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating simplified procedures in a manufacturing method of a semiconductor apparatus in accordance with one or more embodiments of this inventive concept. FIGS. 2A, 2B, 3A, 3B, 4, 5A, 5B, 6, 7A, 7B, 8A, 8B, 9A, 9B, 10A, 10B, 11A, and 11B show schematic cross-sectional views illustrating different stages of a manufacturing method of a semiconductor apparatus in accordance with one or more embodiments of this inventive concept. Referring to these Figures, a manufacturing method of a semiconductor apparatus in accordance with one or more embodiments of this inventive concept is described below.

Figure 2A:
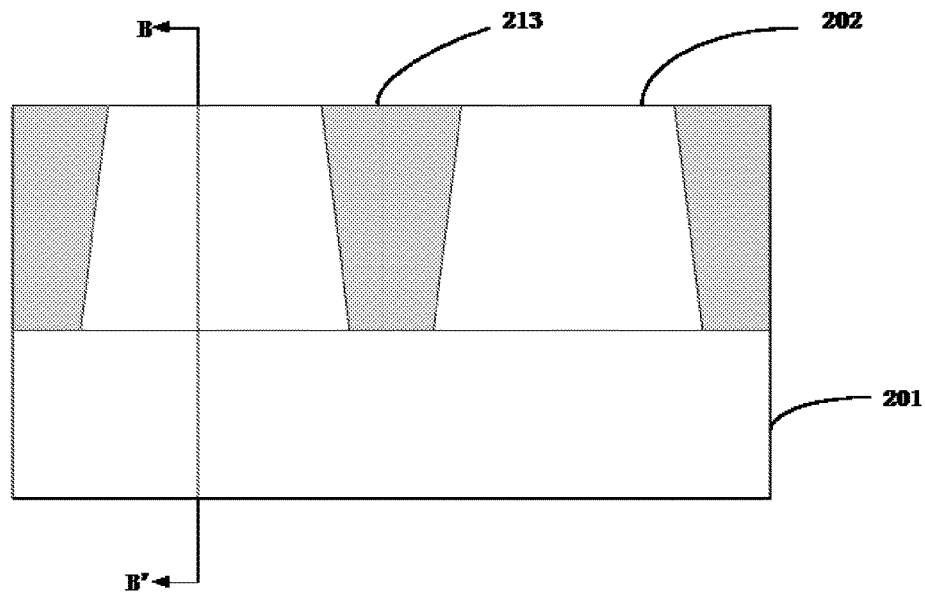
FIG. 2A shows a schematic cross-sectional view illustrating one stage of a manufacturing method of a semiconductor apparatus in accordance with one or more embodiments of this inventive concept, viewed from a first direction.
Figure 2B:
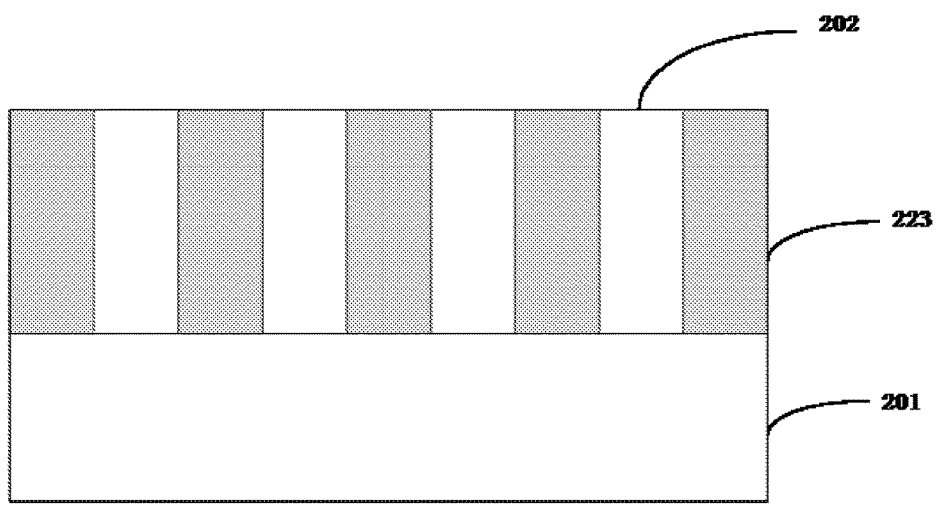
FIG. 2B shows another schematic cross-sectional view of the component shown in FIG. 2A, viewed from a second direction.

Referring to FIG. 1, in step 102, provide a substrate structure. FIG. 2A shows a schematic cross-sectional view illustrating one stage of a manufacturing method of a semiconductor apparatus in accordance with one or more embodiments of this inventive concept, viewed from a first direction. FIG. 2B shows another schematic cross-sectional view of the component shown in FIG. 2A, viewed from a second direction. The cross-sectional view in FIG. 2B is obtained by observing the component in FIG. 2A at a plane that includes line B-B' and is perpendicular to the paper, the second direction is the direction of the arrows in line B-B', as shown in FIG. 2A.

Referring to FIGS. 2A and 2B, the substrate structure comprises a substrate 201, which may be a silicon (Si) substrate, a silicon-on-insulator (SOI) substrate, or a III-V group substrate.

The substrate structure further comprises one or multiple fins 202 on the substrate 201 positioned along the first direction. The first direction is a direction along which the fins 202 extends and is also called the channel direction. The fins 202 may be made of the same material of the substrate 201, but can also be made of a different material.

The substrate structure further comprises a separation region surrounding the fins 202. An upper surface of the separation region is on a substantially same horizontal level with an upper surface of the fins 202. The separation region comprises a first separation region 213 neighboring a first side of the fins 202 along the first direction, and a second separation region 223 neighboring a second side of the fins 202 along the second direction. The second direction may be any direction that is perpendicular to the first direction, and is also called the perpendicular-to-channel direction. The first separation region 213 may locate on one or both sides of the fins 202 along the first direction, the second separation region 223 may locate on one or both sides of the fins 202 along the second direction. In one embodiment, the separation region may be made of dielectric materials such as oxide, nitride, or nitrogen oxide.

Figure 3A:
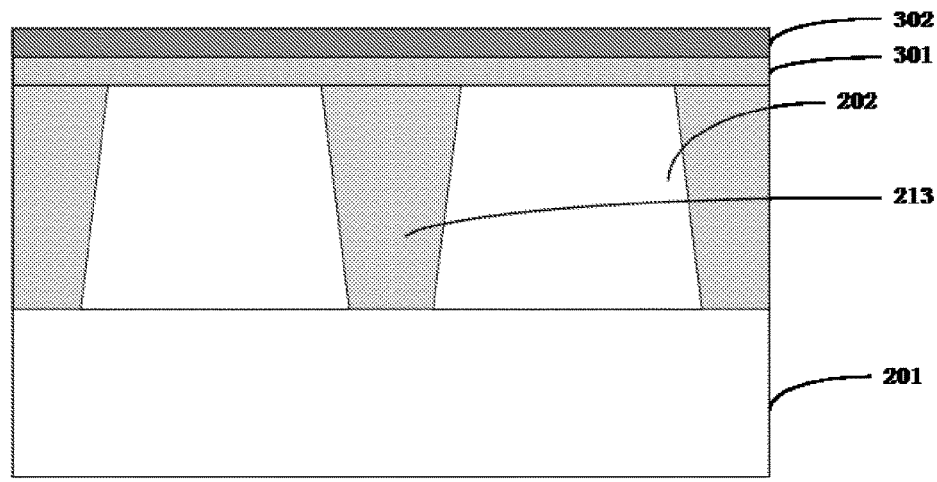
FIG. 3A shows a schematic cross-sectional view illustrating one stage of a manufacturing method of a semiconductor apparatus in accordance with one or more embodiments of this inventive concept, viewed from the first direction.
Figure 3B:
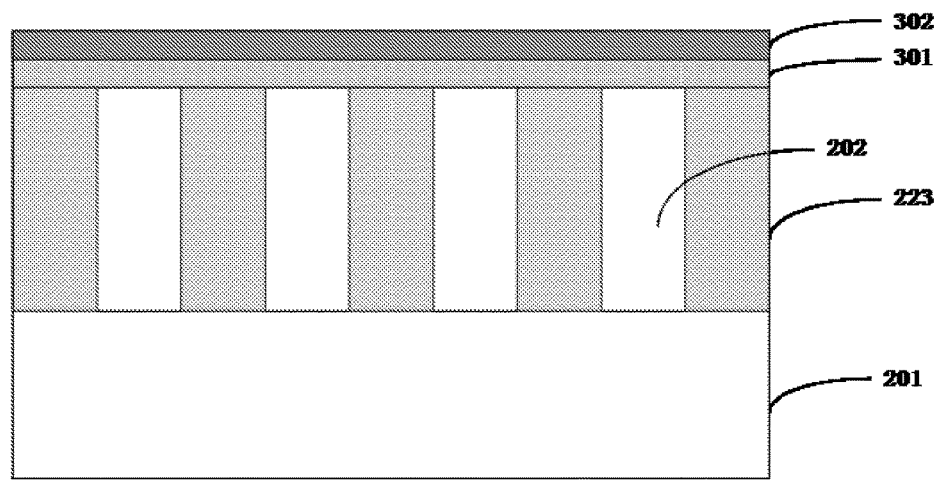
FIG. 3B shows another schematic cross-sectional view of the component shown in FIG. 3A, viewed from the second direction.

Referring to FIGS. 3A and 3B, in step 104, form a first insulation layer 301 on the substrate structure, form a second insulation layer 302 on the first insulation layer 301. Optimally, the first insulation layer 301 and the second insulation layer 302 may have different etching ratios. In one embodiment, the first insulation layer 301 may be an oxide layer, such as a silicon oxide layer, the second insulation layer 302 may be a nitride layer, such as a silicon nitride layer. The first insulation layer 301 and the second insulation layer 302 may also be made of other materials.

Figure 4:
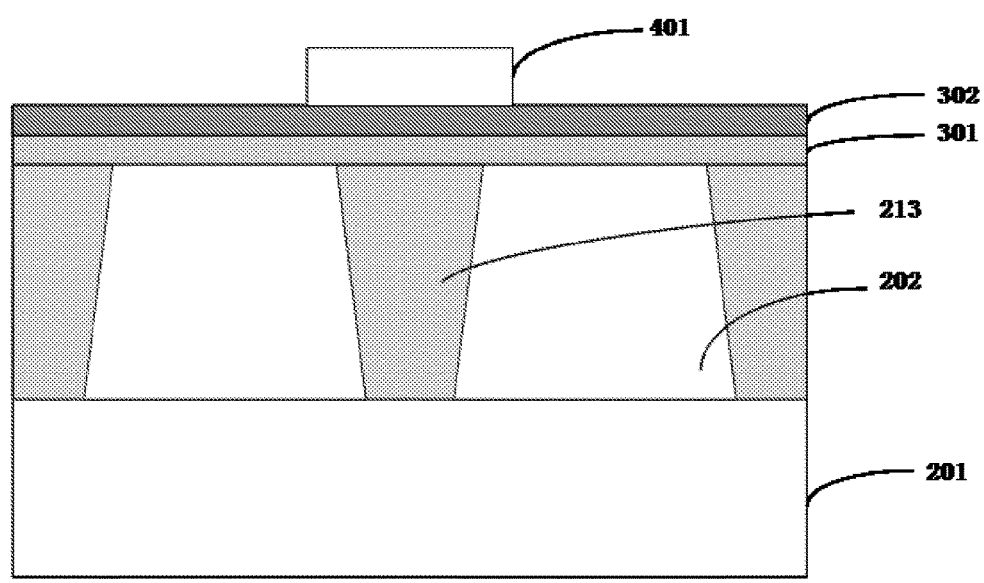
FIGS. 4 and 5A each show a schematic cross-sectional view illustrating one stage of a manufacturing method of a semiconductor apparatus in accordance with one or more embodiments of this inventive concept, viewed from the first direction.

Referring to FIG. 4, in step 106, form a barrier layer 401 to cover a first portion of the second insulation layer 302 on the first separation region 213. In one embodiment, the barrier layer 401 may further cover a portion of the second insulation layer 302 on the upper surface of the fins 202 neighboring the first separation region 213. In other words, the width of the barrier layer 401 in the first direction is greater than or equal to the largest width of the first separation region 213 in the first direction. In one embodiment, the barrier layer 401 may be formed by first forming a photoresist layer on the second insulation layer 302 and then performing a patternization process on the photoresist. The patternization process may be a Single Diffusion Break (SDB) process.

FIG. 4 only shows the barrier layer 401 formed on the first separation region 213 located between two fins 202. In other embodiments, the barrier layer 401 may also be formed on the separation regions neighboring the other side of the fins 202 along the first direction.

Figure 5A:
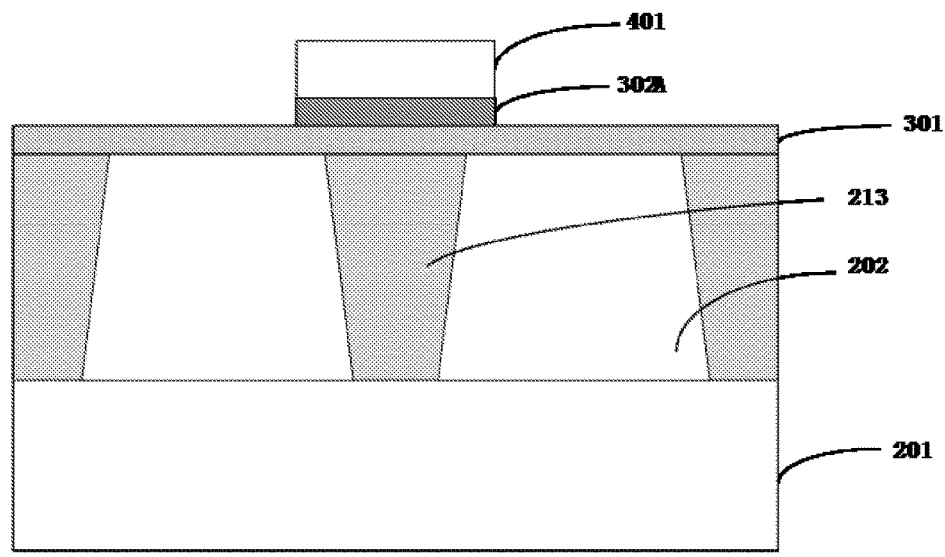
Figure 5B:
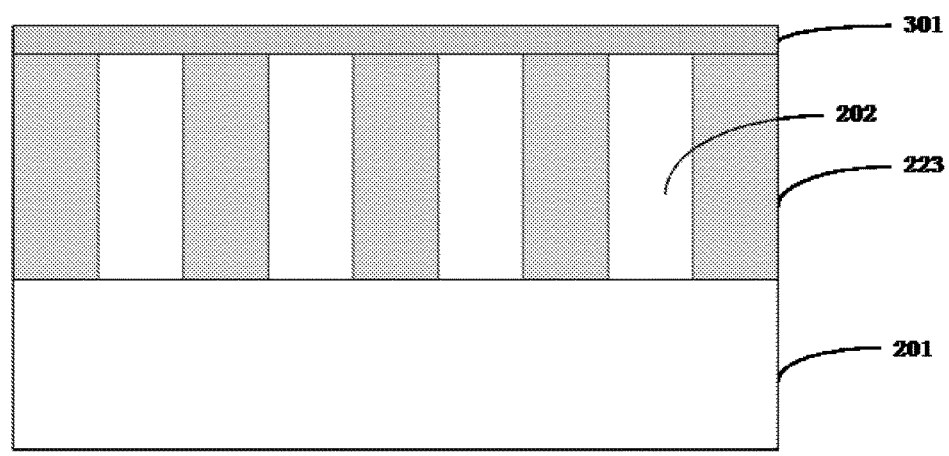
FIG. 5B shows another schematic cross-sectional view of the component shown in FIG. 5A, viewed from the second direction.

Referring to FIGS. 5A and 5B, in step 108, perform a first etching process using the barrier layer 401 as a mask to remove a second portion of the second insulation layer 302 that is not covered by the barrier layer 401. The first portion of the second insulation layer 302 is retained and is annotated as a remaining second insulation layer 302A. In one embodiment, the first etching process may be a wet etching or a dry etching process. In one embodiment, the first etching process will stop upon reaching the first insulation layer 301.

Figure 6:
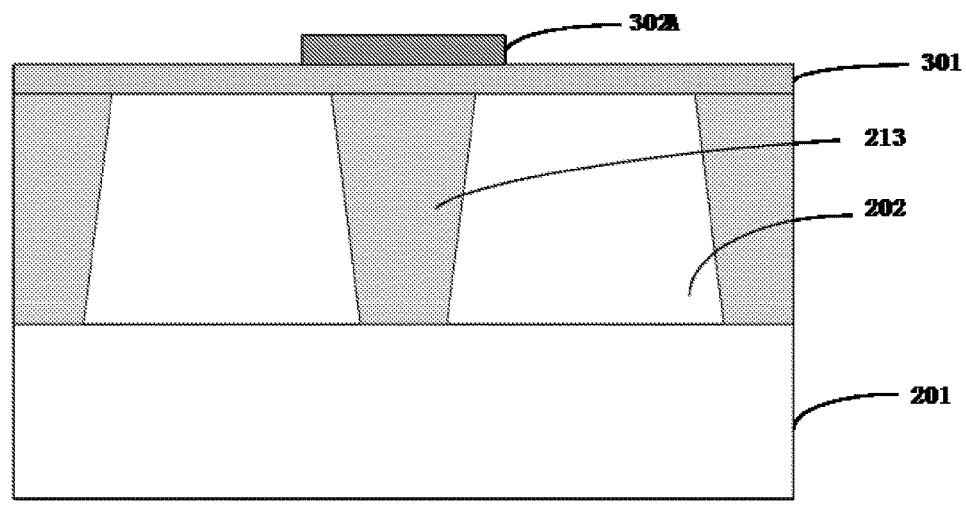
FIGS. 6 and 7A each show a schematic cross-sectional view illustrating one stage of a manufacturing method of a semiconductor apparatus in accordance with one or more embodiments of this inventive concept, viewed from the first direction.

Referring to FIG. 6, in step 110, remove the barrier layer 401 to expose the remaining second insulation layer 302A.

Figure 7A:
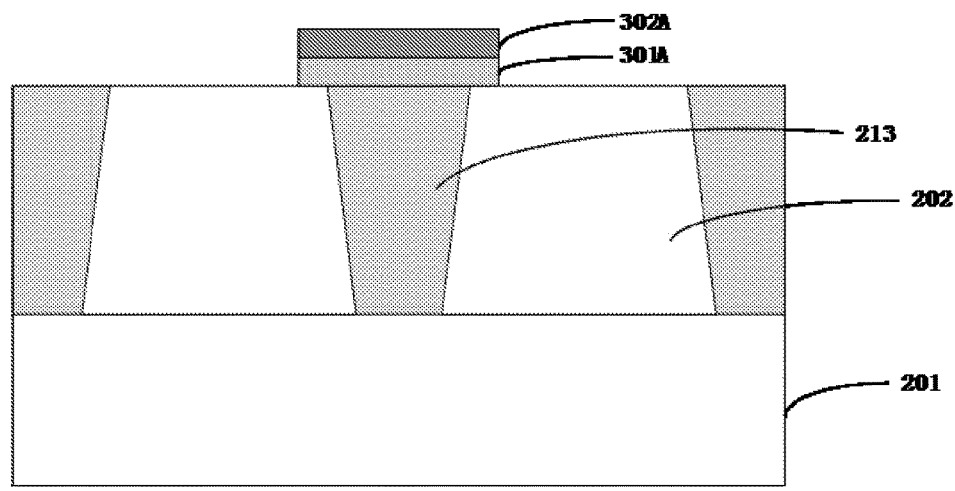
Figure 7B:
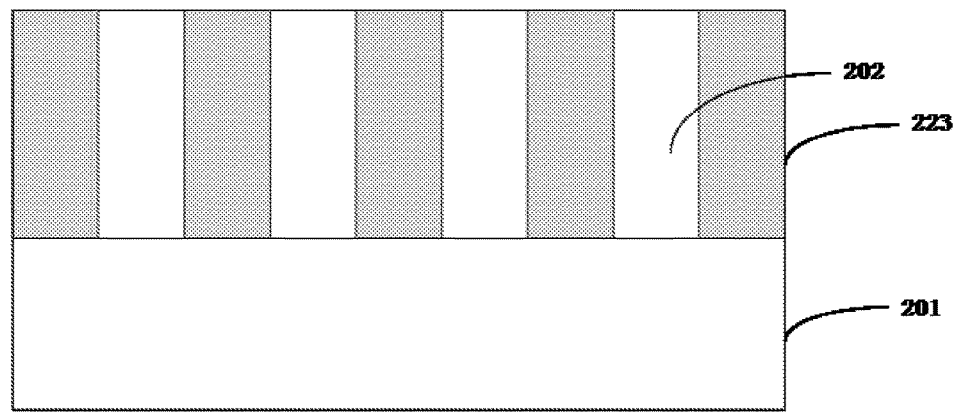
FIG. 7B shows another schematic cross-sectional view of the component shown in FIG. 7A, viewed from the second direction.

Referring to FIGS. 7A and 7B, in step 112, perform a second etching process using the remaining second insulation layer 302A as a mask to remove a portion of the first insulation layer 301 that is not covered by the remaining second insulation layer 302A. The portion of the first insulation layer 301 underneath the remaining second insulation layer 302A is retained and is annotated as a remaining first insulation layer 301A. In one embodiment, the second etching process will stop upon reaching the upper surface of the fins 202 or the upper surface of the separation regions surrounding the fins 202.

Figure 8A:
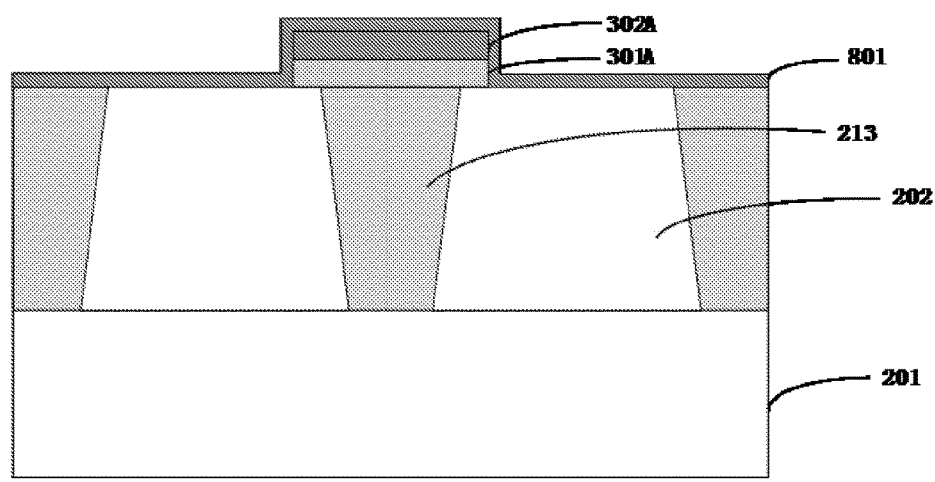
FIG. 8A shows a schematic cross-sectional view illustrating one stage of a manufacturing method of a semiconductor apparatus in accordance with one or more embodiments of this inventive concept, viewed from the first direction.
Figure 8B:
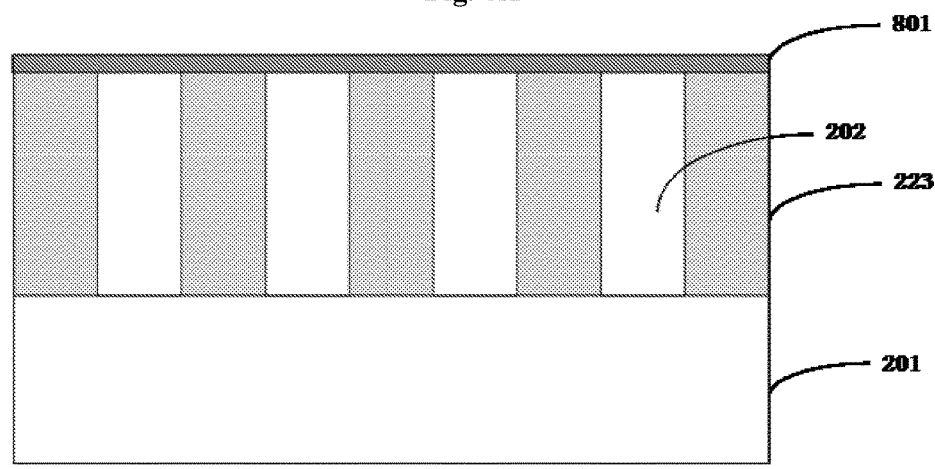
FIG. 8B shows another schematic cross-sectional view of the component shown in FIG. 8A, viewed from the second direction.
Figure 9A:
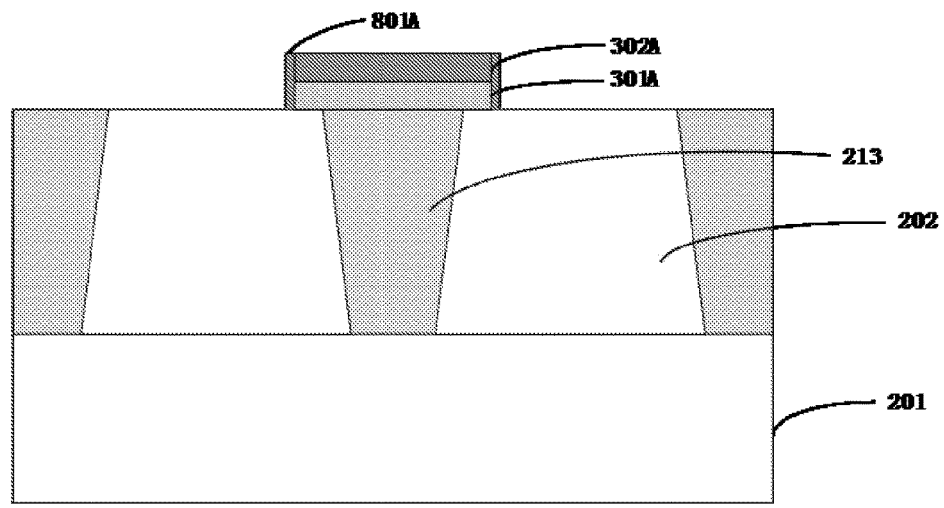
FIG. 9A shows a schematic cross-sectional view illustrating one stage of a manufacturing method of a semiconductor apparatus in accordance with one or more embodiments of this inventive concept, viewed from the first direction.
Figure 9B:
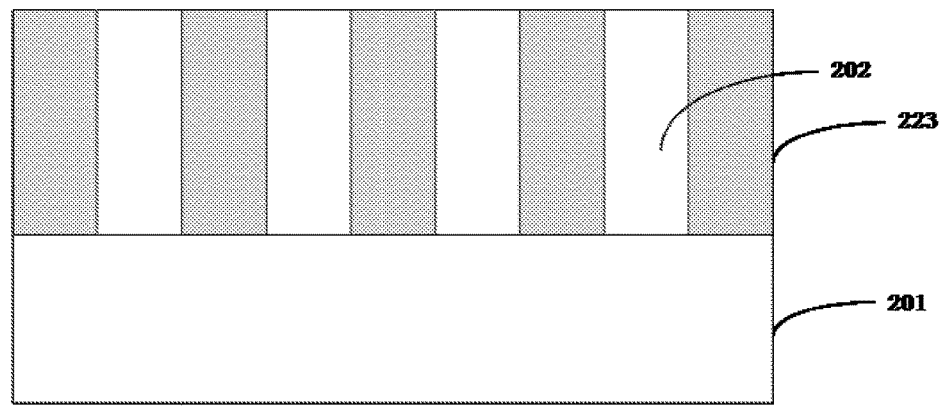
FIG. 9B shows another schematic cross-sectional view of the component shown in FIG. 9A, viewed from the second direction.

Referring to FIGS. 8A and 8B, in step 114, form a third insulation layer 801A on side surfaces of the remaining first insulation layer 301A and the remaining second insulation layer 302A. In one embodiment, an insulation material layer 801 is first deposited on the upper surface of the fins 202 and the upper surface of the separation regions that are not covered by the remaining first insulation layer 301A or the remaining second insulation layer 302A, on the side surfaces of the remaining first insulation layer 301A and the remaining second insulation layer 302A, and on an upper surface of the remaining second insulation layer 302A. Referring to FIGS. 9A and 9B, use an anisotropy etching process to remove a portion of the insulation material layer 801 that is on the upper surfaces of the fins 202 and the upper surface of the separation regions that are not covered by the remaining first insulation layer 301A and the remaining second insulation layer 302A, and on the upper surface of the remaining second insulation layer 302A. A portion of the insulation material layer 801 on the side surfaces of the remaining first insulation layer 301A and the remaining second insulation layer 302A is retained and is annotated as the third insulation layer 801A. Optimally, the third insulation layer 801A and the second insulation layer 302 may be made of the same material. In one embodiment, both the third insulation layer 801A and the second insulation layer 302 are a nitride layer, such as a silicon nitride layer.

In some embodiments, the third insulation layer 801A may also be formed on the upper surface of the remaining second insulation layer 302A. In that case, after the insulation material layer 801 is deposited, only a portion of the insulation material layer 801 on the upper surface of the remaining second insulation layer 302A will be removed, the rest of them will be retained on the upper surface of the remaining second insulation layer 302A and become part of the third insulation layer 801A.

Figure 10A:
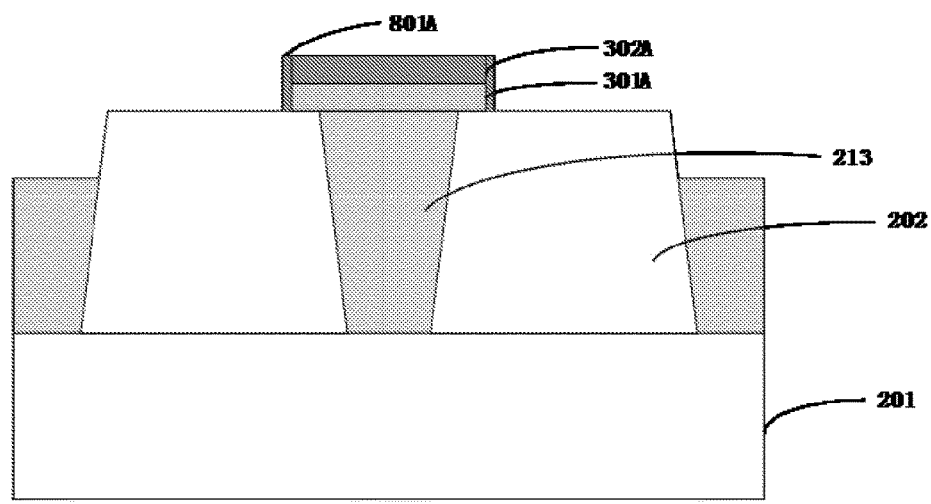
FIG. 10A shows a schematic cross-sectional view illustrating one stage of a manufacturing method of a semiconductor apparatus in accordance with one or more embodiments of this inventive concept, viewed from the first direction.
Figure 10B:
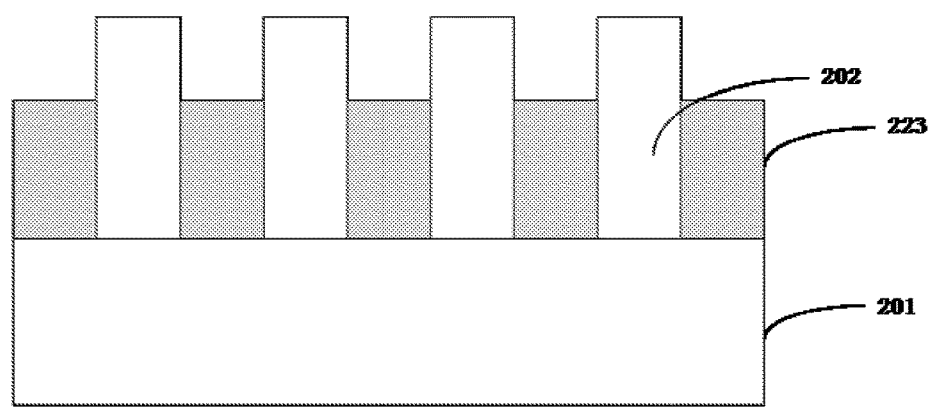
FIG. 10B shows another schematic cross-sectional view of the component shown in FIG. 10A, viewed from the second direction.

Referring to FIGS. 10A and 10B, in step 116, perform a third etching process using the remaining second insulation layer 302A and the third insulation layer 801A as a mask to remove a portion of the second separation region 223, so that an upper surface of the remaining second separation region 223 is lower than the upper surface of the fins 202. During the third etching process, the remaining first insulation layer 301A is protected by the remaining second insulation layer 302A and the third insulation layer 801A and is not removed. The third etching process removes a portion of the separation region that is not covered by the remaining first insulation layer 301A, including the second separation region and a portion of the separation region neighboring the first side of the fins 202 along the first direction. After the third etching process, the upper surface of the separation region that is not covered by the remaining first insulation layer 301A is lower than the upper surface of the fins 202.

Figure 11A:
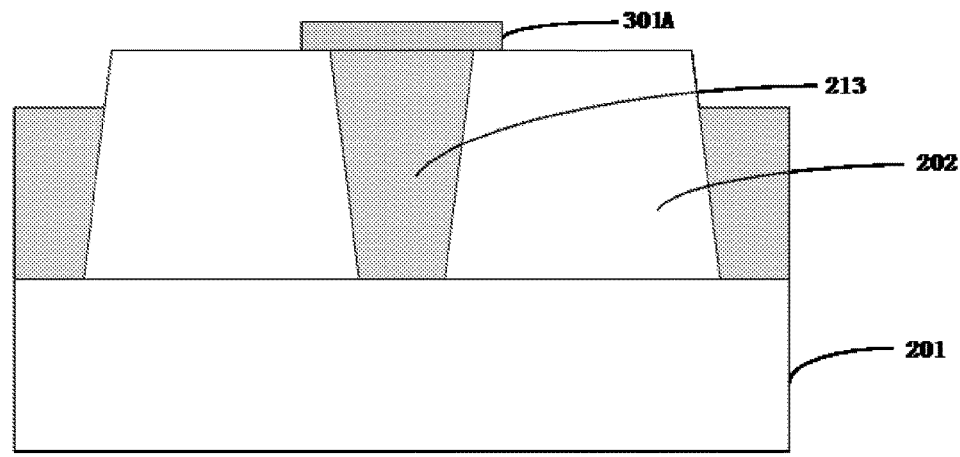
FIG. 11A shows a schematic cross-sectional view illustrating one stage of a manufacturing method of a semiconductor apparatus in accordance with one or more embodiments of this inventive concept, viewed from the first direction.
Figure 11B:
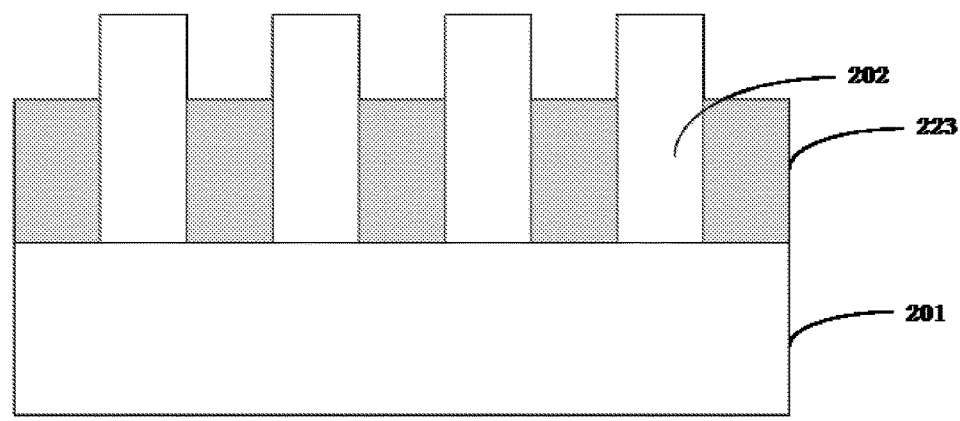
FIG. 11B shows another schematic cross-sectional view of the component shown in FIG. 11A, viewed from the second direction.

Referring to FIGS. 11A and 11B, in step 118, remove the remaining second insulation layer 302A and the third insulation layer 801A. The remaining first insulation layer 301A on the first separation region 213 is retained.

This concludes the description of a manufacturing method of a semiconductor apparatus in accordance with one embodiment of this inventive concept. The first separation region 213 and the second separation region 223 have different heights, and the upper surface of the first separation region 213 is on a substantially same horizontal level as the upper surface of the fins 202, and is covered by the remaining first insulation layer 301A. Therefore, when dummy gate structures are formed on the first insulation layer 301 in succeeding stages, the dummy gate structures will not bridge the fins even with some deviations of their positions. This effectively reduces the electrical leakage and improves the reliability of the devices. Additionally, the dummy gate structures, even with some deviations on their positions, will not affect the contour of the epitaxially grown semiconductor materials and therefore will not affect the induced stress in the channel, which improves the migration rate of charge carriers in the semiconductor device. In this method, the third insulation layer 801A is formed on the side surfaces of the remaining first insulation layer 301A and the remaining second insulation layer 302A before a portion of the second separation region 223 is removed, the third insulation layer 801A can protect the remaining first insulation layer 301A from being damaged.

Referring to FIGS. 11A and 11B, a semiconductor apparatus made with a manufacturing method in accordance with one or more embodiments of this inventive concept is described below.

The semiconductor apparatus comprises a substrate 201; one or multiple fins 202 positioned along a first direction on the substrate 201; and a separation region surrounding the fins 202. The separation region comprises a first separation region 213 neighboring a first side of the fins 202 along the first direction, and a second separation region 223 neighboring a second side of the fins 202 along a second direction that is different from the first direction. An upper surface of the first separation region 213 is on a substantially same horizontal level with an upper surface of the fins 202, an upper surface of the second separation region 223 is lower than the upper surface of the fins 202. The semiconductor apparatus further comprises a first insulation layer 301A on the first separation region 213. In one embodiment, the first insulation layer 301A may further cover a portion of the upper surface of the fins 202 neighboring the first separation region 213.

Figure 12:
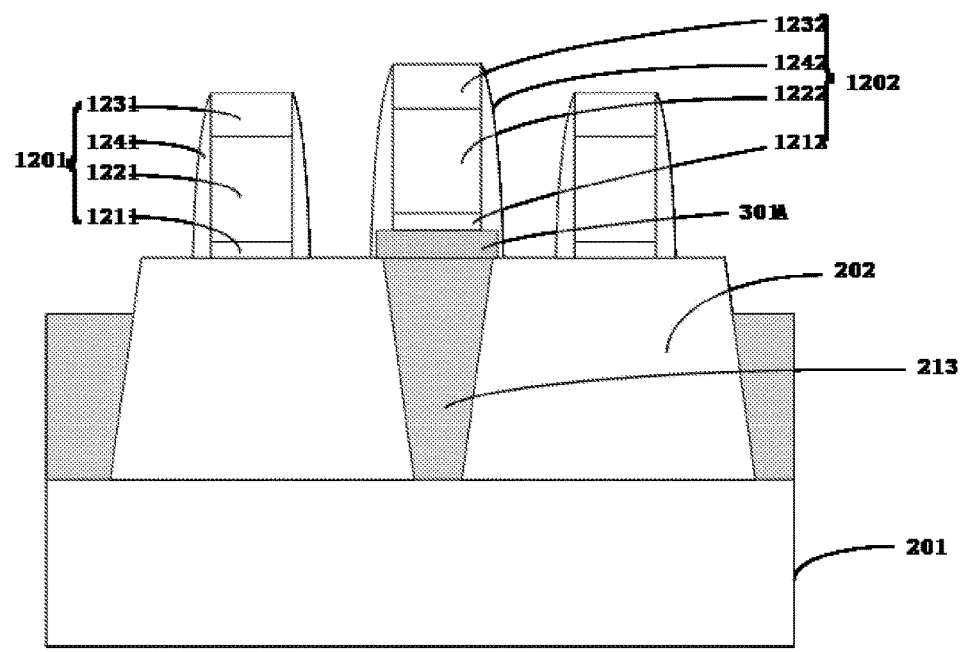
FIGS. 12, 13, 14, and 15A each show a schematic cross-sectional view illustrating one stage of a manufacturing method of a semiconductor apparatus in accordance with one or more embodiments of this inventive concept, viewed from the first direction.

Referring to FIG. 12, in one embodiment, after the semiconductor apparatus shown in FIGS. 11A and 11B is formed, the manufacturing method further comprises: forming a first gate structure 1201 on the fins 202, forming a second gate structure 1202 on the remaining first insulation layer 301A. Usually, the second gate structure 1202 is a dummy gate structure.

In one embodiment, the first gate structure 1201 comprises a first dielectric layer 1211, which may be made of silicon oxide, on the fins 202; a first gate 1221, which may be made of poly-crystalline silicon, on the first dielectric layer 1211; a first hard mask layer 1231, which may be made of silicon nitride, on the first gate 1221; and first separation objects 1241, which may be made of silicon oxide or silicon nitride, formed on side surfaces of the first dielectric layer 1211, the first gate 1221, and the first hard mask layer 1231.

In one embodiment, the second gate structure 1202 comprises a second dielectric layer 1212, which may be made of silicon oxide, on the remaining first insulation layer 301A; a second gate 1222, which may be made of poly-crystalline silicon, on the second dielectric layer 1212; a second hard mask layer 1232, which may be made of silicon nitride, on the second gate 1222; and second separation object 1242, which may be made of silicon oxide or silicon nitride, formed on side surfaces of the second dielectric layer 1212, the second gate 1222, and the second hard mask layer 1232. The second separation objects 1242 covers a portion of the upper surface of the fins 202 neighboring the first separation region 213 that is underneath the second gate structure 1202.

In one embodiment, after the first gate structure 1201 and the second gate structure 1202 are formed, the manufacturing method further comprises the following steps.

Figure 13:
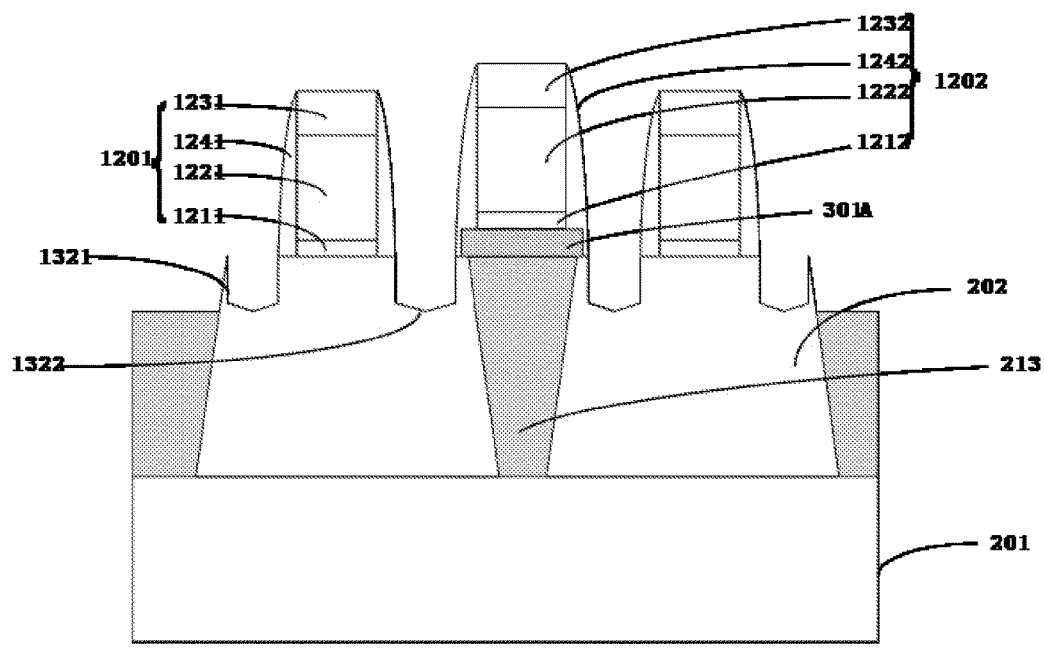
Figure 14:
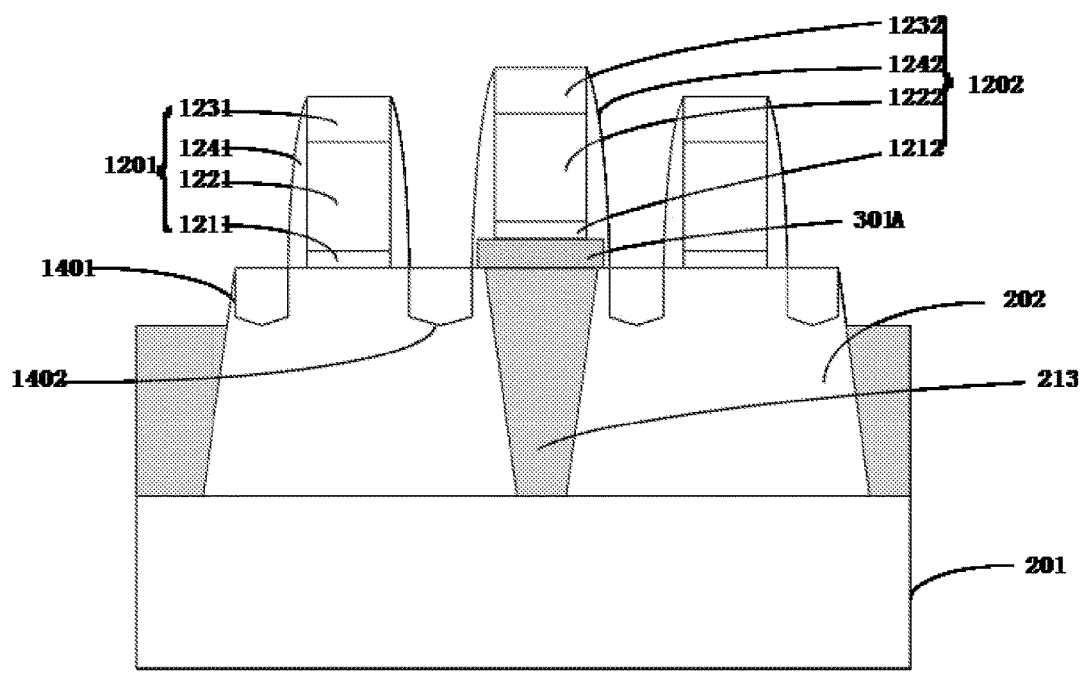

Referring to FIG. 13, etch the fins 202 on two sides of the first gate structure 1201 using the first gate structure 1201 and the second gate structure 1202 as masks to form dents such as the first dent 1321 and the second dent 1322. Referring to FIG. 14, epitaxially grow semiconductor materials in the first dent 1321 and the second dent 1322 to form a source region 1401 and a drain region 1402, respectively. In one embodiment, the semiconductor materials in the first dent 1321 and the second dent 1322 may be silicon-germanium (SiGe), silicon carbide (SiC), or silicon. When silicon is used as the semiconductor material in the first dent 1321 and the second dent 1322, Phosphorus can be in-situ doped.

Referring to FIG. 14, this inventive concept also presents another semiconductor apparatus. Comparing with the semiconductor apparatus shown in FIGS. 11A and 11B, the semiconductor apparatus shown in FIG. 14 further comprises a first gate structure 1201 on the fins 202, and a second gate structure 1202 on the remaining first insulation layer 301A. Additionally, this semiconductor apparatus further comprises a source region 1401 and a drain region 1402, which are formed by epitaxially growing semiconductor materials on two sides of the first gate structure 1201. In one embodiment, the first gate structure 1201 and the second gate structure 1202 may have the same structures as those disclosed in the manufacturing method described above, which are not repeated here in the interest of conciseness.

In this semiconductor apparatus, an upper surface of the first separation region is on a substantially same horizontal level with the upper surface of the fins, and the first insulation layer is formed on the first separation region. Therefore, when dummy gate structures, such as the second gate structure as shown in FIG. 14, are formed on the first insulation layer, these gate structures will not connect with the fins even if there are some deviations on their positions. This effectively reduces the electrical leakage and improves the reliability of the devices. Additionally, the dummy gate structures, even with some deviations on their positions, will not affect the contour of the epitaxially grown semiconductor materials and therefore will not affect the induced stress in the channel, which improves the migration rate of charge carriers in the semiconductor device.

Referring to FIGS. 15A, 15B, 16A, 16B, 17A, 17B, 18A, 18B, 19A, and 19B, this inventive concept further presents an embodiment of a manufacturing method for the substrate structure described above.

Figure 15A:
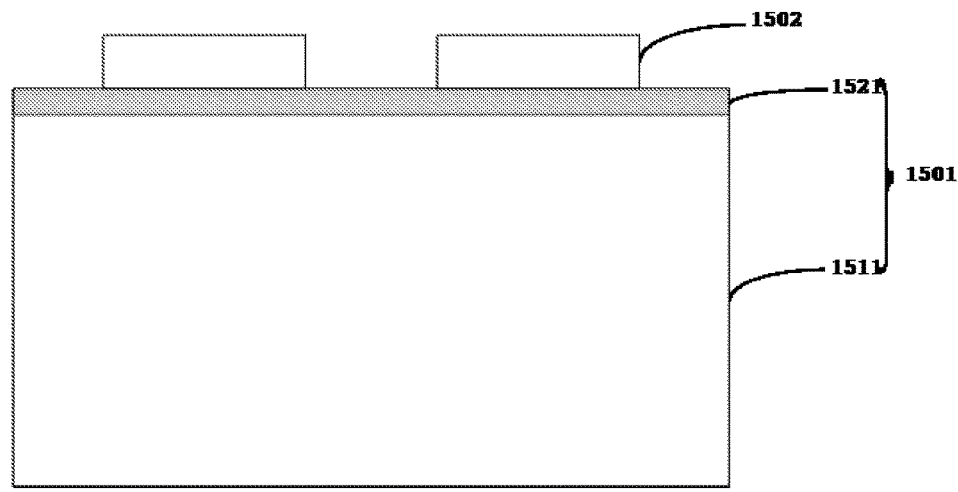
Figure 15B:
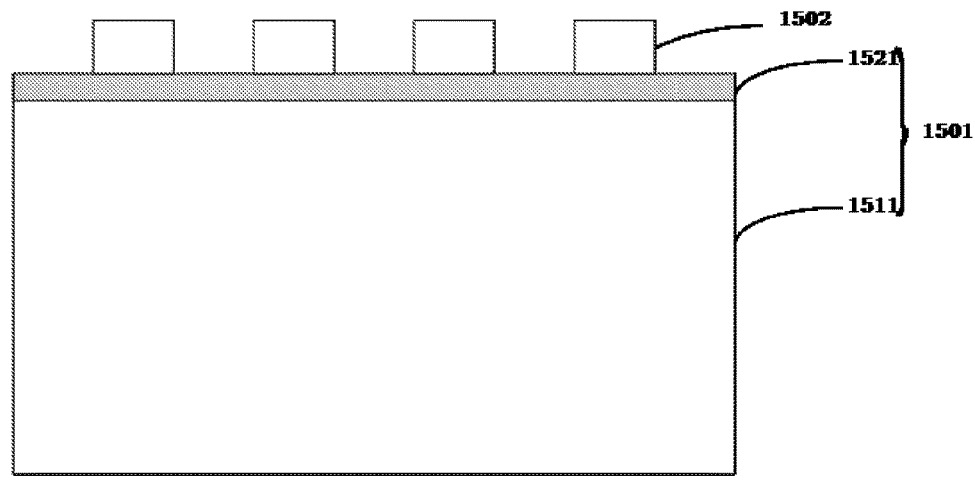
FIG. 15B shows another schematic cross-sectional view of the component shown in FIG. 15A, viewed from the second direction.

Referring to FIGS. 15A and 15B, provide an initial substrate 1501, form a hard mask layer 1502 on the initial substrate 1501. The hard mask layer 1502 may be formed by self-aligned double patterning (SADP) technique and may be made of silicon nitride. In one embodiment, the initial substrate 1501 comprises an initial semiconductor layer 1511 and an initial oxide layer 1521 on the initial semiconductor layer 1501. The initial oxide layer 1521 may work as a buffer layer to reduce the stress between the initial substrate 1501 and the hard mask layer 1502.

Figure 16A:
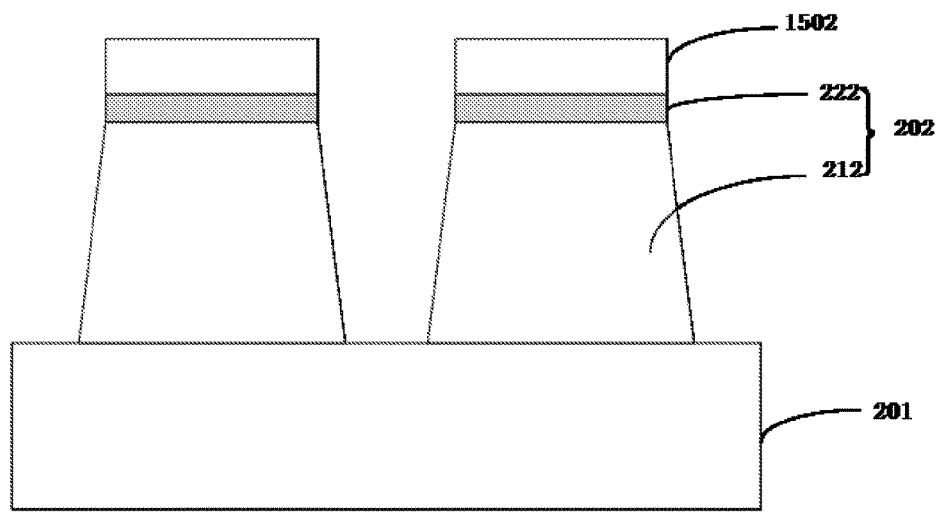
FIG. 16A shows a schematic cross-sectional view illustrating one stage of a manufacturing method of a semiconductor apparatus in accordance with one or more embodiments of this inventive concept, viewed from the first direction.
Figure 16B:
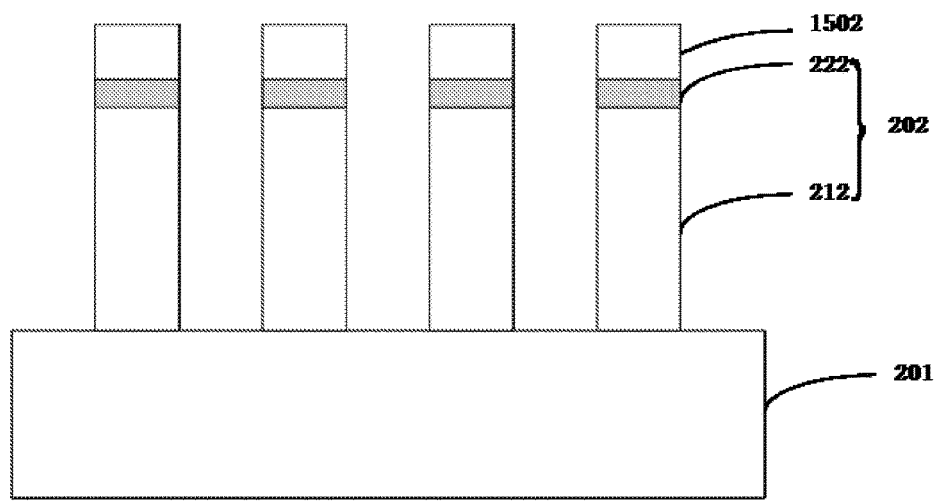
FIG. 16B shows another schematic cross-sectional view of the component shown in FIG. 16A, viewed from the second direction.

Referring to FIGS. 16A and 16B, etch the initial substrate 1501 using the hard mask layer 1502 as a mask to form the substrate 201 and one or multiple fins 202 on the substrate 201. In one embodiment, the initial substrate 1501 comprises the initial semiconductor layer 1511 and the initial oxide layer 1521 on the initial semiconductor layer 1501. Therefore the fins 202 also comprises a semiconductor layer 212 and an oxide layer 222 on the semiconductor layer 212.

Figure 17A:
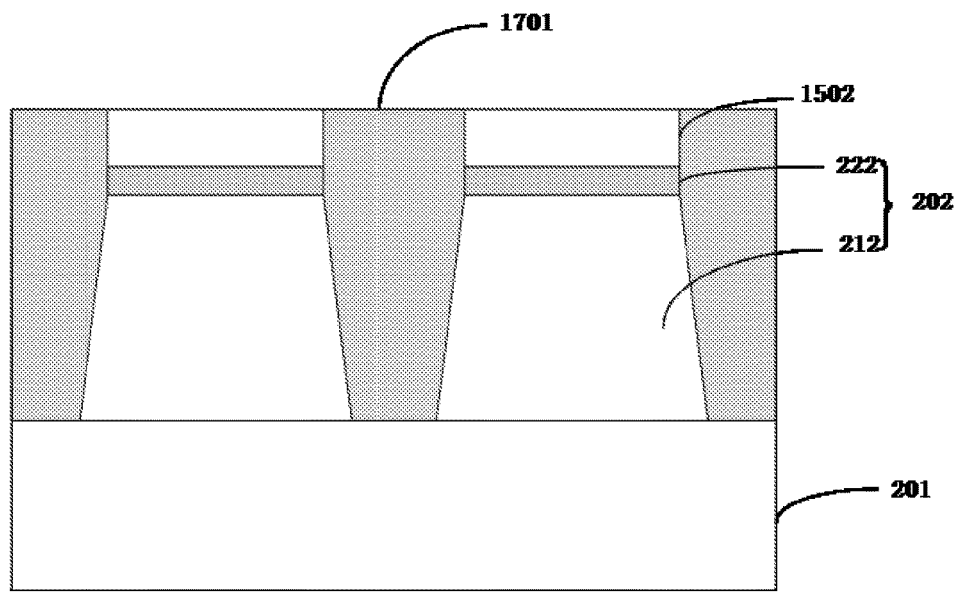
FIG. 17A shows a schematic cross-sectional view illustrating one stage of a manufacturing method of a semiconductor apparatus in accordance with one or more embodiments of this inventive concept, viewed from the first direction.
Figure 17B:
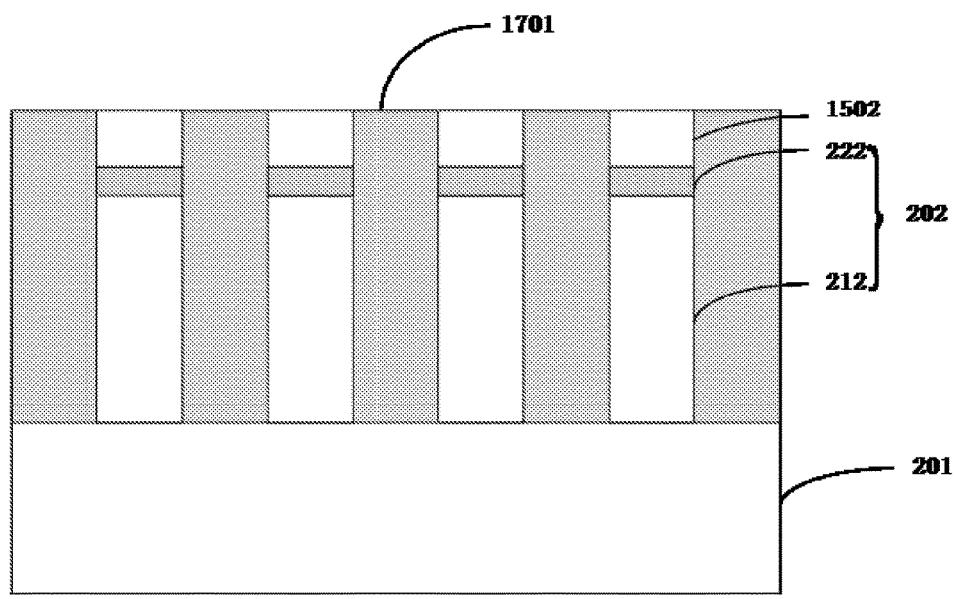
FIG. 17B shows another schematic cross-sectional view of the component shown in FIG. 17A, viewed from the second direction.

Referring to FIGS. 17A and 17B, separation material 1701 is deposited around the fins 202 to fill the area surrounding the fins 202. An upper surface of the separation material 1701 is on a substantially same horizontal level with an upper surface of the hard mask layer 1502. As an example, the separation material 1701 may be deposited by Flowable Chemical Vapor Deposition (FCVD) followed by a planarization process such as Chemical-Machanical Polishing (CMP), so that the upper surface of the separation material 1701 is on a substantially same horizontal level with the upper surface of the hard mask layer 1502. Additionally, in another embodiment, before the separation material 1701 is deposited, a liner layer may be formed on the structure shown in FIG. 16A, the liner layer may be a silicon oxide layer and may be formed by an In-Situ Steam Generation (ISSG) process. The liner layer may fix defects that may exist on fins' surfaces.

Figure 18A:
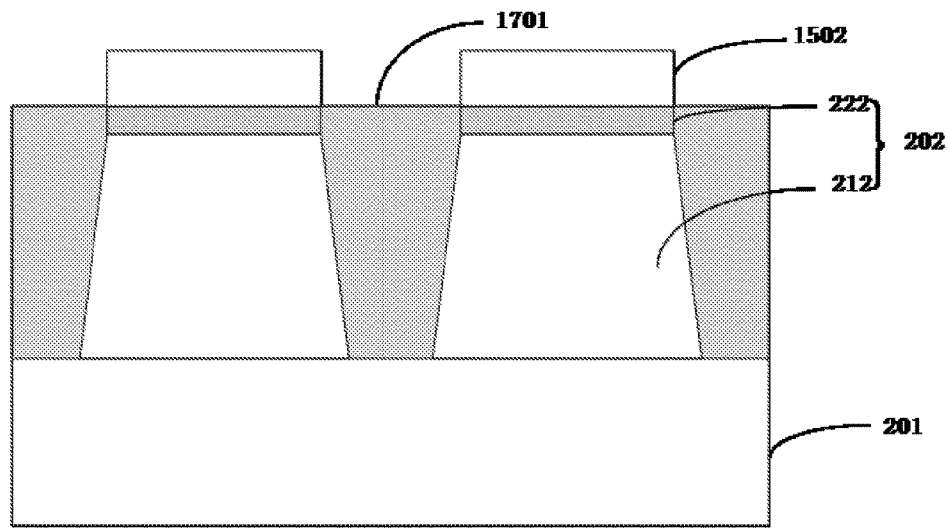
FIG. 18A shows a schematic cross-sectional view illustrating one stage of a manufacturing method of a semiconductor apparatus in accordance with one or more embodiments of this inventive concept, viewed from the first direction.
Figure 18B:
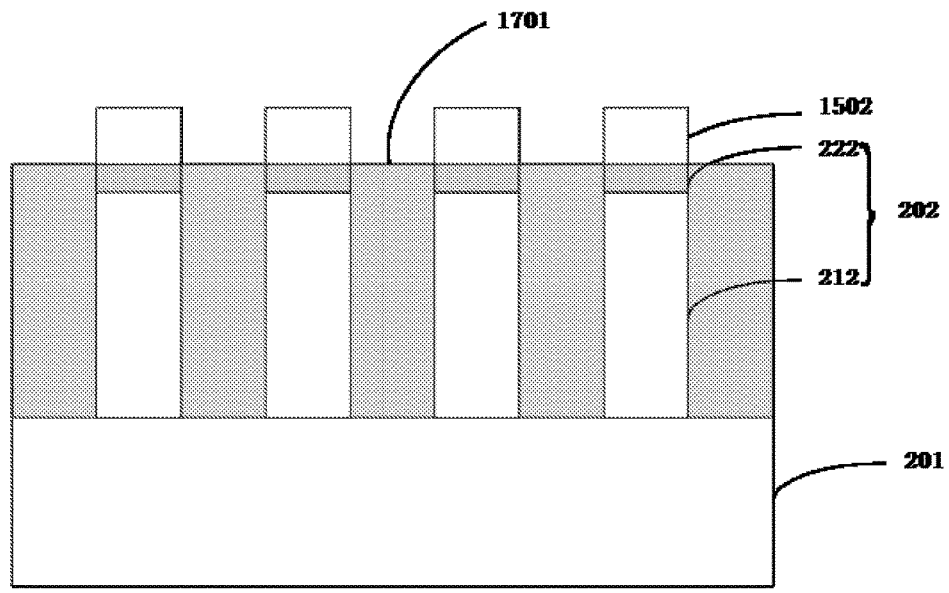
FIG. 18B shows another schematic cross-sectional view of the component shown in FIG. 18A, viewed from the second direction.

Referring to FIGS. 18A and 18B, etch back the separation layer 1701 to expose the hard mask layer 1502.

Figure 19A:
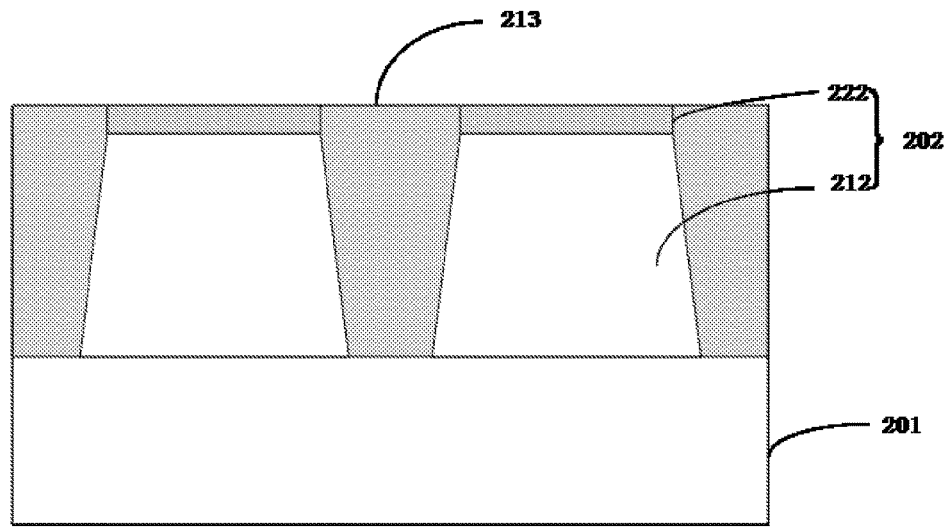
FIG. 19A shows a schematic cross-sectional view illustrating one stage of a manufacturing method of a semiconductor apparatus in accordance with one or more embodiments of this inventive concept, viewed from the first direction.
Figure 19B:
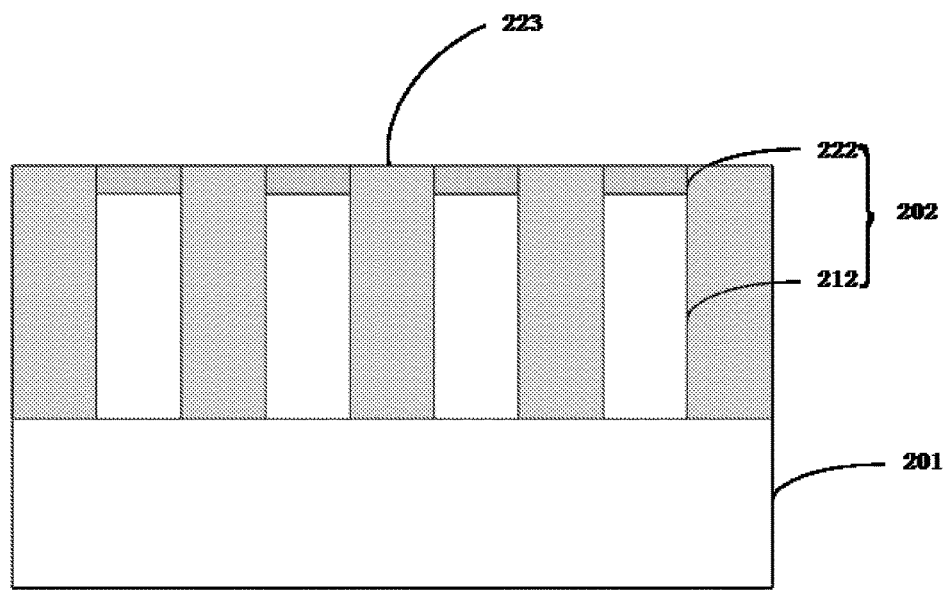
FIG. 19B shows another schematic cross-sectional view of the component shown in FIG. 19A, viewed from the second direction.

Referring to FIGS. 19A and 19B, remove the hard mask layer 1502 to form the substrate structure.

Compared with the substrate structure shown in FIGS. 2A and 2B, the substrate structure shown in FIGS. 19A and 19B has an additional oxide layer 222. The oxide layer 222 is optional.

After the substrate structure is formed, the steps shown in FIG. 1 may be performed on the substrate structure according to the description above.

The semiconductor apparatus and its manufacturing method in accordance with one or more embodiments of this inventive concept has been presented. While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. The abstract section is provided herein for convenience and, due to word count limitation, is accordingly written for reading convenience and shall not be employed to limit the scope of the claims. It is therefore intended that the claims be interpreted as including all such alterations, permutations, and equivalents.

What is claimed is:

1. A method for manufacturing a semiconductor apparatus, comprising:
    providing a substrate structure, wherein the substrate structure comprises:
        a substrate;
        one or multiple fins positioned along a first direction on the substrate; and
        a separation region surrounding the fins,
        wherein an upper surface of the separation region is on a substantially same horizontal level as an upper surface of the fins, the separation region comprises a first separation region neighboring a first side of the fins along the first direction, and a second separation region neighboring a second side of the fins along a second direction that is different from the first direction;
    forming a first insulation layer on the substrate structure;
    forming a second insulation layer on the first insulation layer;
    forming a barrier layer on a first portion of the second insulation layer on the first separating region;
    performing a first etching process using the barrier layer as a mask to remove a second portion of the second insulation layer that is not covered by the barrier layer;
    removing the barrier layer;
    performing a second etching process using the remaining second insulation layer as a mask to remove a portion of the first insulation layer that is not covered by the remaining second insulation layer;
    forming a third insulation layer on side surfaces of the remaining first insulation layer and the remaining second insulation layer;
    performing a third etching process using the remaining second insulation layer and the third insulation layer as a mask to remove a portion of the second separation region that is not covered by the remaining second insulation layer or the third insulation layer; and
    removing the remaining second insulation layer and the third insulation layer.

2. The method of claim 1, wherein the barrier layer further covers a portion of the second insulation layer on the upper surface of the fins neighboring the first separation region.

3. The method of claim 1, wherein forming a third insulation layer on side surfaces of the remaining first insulation layer and the remaining second insulation layer comprises:
    forming an insulation material layer to cover a surface that is not covered by either the remaining first insulation layer or the remaining second insulation layer, side surfaces of the remaining first insulation layer and the remaining second insulation layer, and an upper surface of the remaining second insulation layer; and
    removing a portion of the insulation material layer on the surface that is not covered by the remaining first insulation layer and the remaining second insulation layer, and on the upper surface of the remaining second insulation layer, the remaining insulation material layer is the third insulation layer.

4. The method of claim 1, wherein the first insulation layer and the second insulation layer have different etching ratios.

5. The method of claim 1, wherein the first insulation layer is an oxide layer, the second insulation layer is a nitride layer, and the third insulation layer is a nitride layer.

6. The method of claim 1, wherein providing a substrate structure comprises:
    providing an initial substrate;
    forming a patterned hard mask layer on the initial substrate;
    etching the initial substrate using the hard mask layer as a mask to form the substrate and one or multiple fins on the substrate;
    depositing separation material to fill areas surrounding the fins, wherein an upper surface of the separation material is on a substantially same horizontal level with an upper surface of the hard mask layer;
    etching back the separation material to expose the hard mask layer; and
    removing the hard mask layer to form the substrate structure.

7. The method of claim 6, wherein the initial substrate comprises an initial semiconductor layer and an initial oxide layer on the initial semiconductor layer, the fins comprises a semiconductor layer and an oxide layer on the semiconductor layer.

8. The method of claim 1, further comprising:
    forming a first gate structure on the fins; and
    forming a second gate structure on the remaining first insulation layer.

9. The method of claim 8, further comprising:
    etching the fins on two sides of the first gate structure using the first gate structure and the second gate structure as masks to form dents; and
    epitaxially growing semiconductor materials in the dents to form a source region and a drain region.

10. The method of claim 9, wherein the semiconductor materials comprise silicon-germanium (SiGe) or silicon carbide (SiC).

11. The method of claim 8, wherein the first gate structure comprises:
    a first dielectric layer on the fins;
    a first gate on the first dielectric layer;
    a first hard mask layer on the first gate; and
    first separation objects on side surfaces of the first dielectric layer, the first gate, and the first hard mask layer, wherein the second gate structure comprises:
    a second dielectric layer on the remaining first insulation layer;
    a second gate on the second dielectric layer;
    a second hard mask layer on the second gate; and
    second separation objects on side surfaces of the second dielectric layer, the second gate, and the second hard mask layer, wherein the second separation objects cover a portion of the upper surface of the fins next to the first separation region that is underneath the second gate structure.

12. The method of claim 11, wherein the first dielectric layer and the second dielectric layer are made of silicon oxide, the first gate and the second gate are made of poly-crystalline silicon, and the first hard mask layer and the second hard mask layer are made of silicon nitride.

* * * * *